(12) United States Patent
Sang et al.

(10) Patent No.: US 12,367,819 B2
(45) Date of Patent: Jul. 22, 2025

(54) DISPLAY DEVICE

(71) Applicant: LG Display Co., Ltd., Seoul (KR)

(72) Inventors: WooKyu Sang, Paju-si (KR); Moonsoo Chung, Paju-si (KR); Taehun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/787,575

(22) Filed: Jul. 29, 2024

(65) Prior Publication Data
US 2024/0386841 A1 Nov. 21, 2024

Related U.S. Application Data

(63) Continuation of application No. 18/468,220, filed on Sep. 15, 2023, now Pat. No. 12,080,228.

(30) Foreign Application Priority Data

Sep. 29, 2022 (KR) .......................... 10-2022-0124040

(51) Int. Cl.
*G09G 3/32* (2016.01)
*H10H 20/856* (2025.01)
*H10H 29/14* (2025.01)

(52) U.S. Cl.
CPC ............. *G09G 3/32* (2013.01); *H10H 20/856* (2025.01); *H10H 29/142* (2025.01); *G09G 2300/0408* (2013.01); *G09G 2300/0426* (2013.01); *G09G 2300/0819* (2013.01); *G09G 2300/0852* (2013.01); *G09G 2300/0861* (2013.01); *G09G 2310/0202* (2013.01); *G09G 2310/08* (2013.01); *G09G 2320/0233* (2013.01); *G09G 2320/0252* (2013.01); *G09G 2320/045* (2013.01)

(58) Field of Classification Search
CPC .......... G09G 3/32; H01L 33/60; H01L 27/156
USPC ....................................................... 345/212
See application file for complete search history.

(56) References Cited

U.S. PATENT DOCUMENTS

| | | |
|---|---|---|
| 2009/0146987 A1 | 6/2009 | Kim et al. |
| 2017/0263183 A1 | 9/2017 | Lin et al. |
| 2018/0005576 A1 | 1/2018 | Yoon et al. |

(Continued)

OTHER PUBLICATIONS

Intellectual Property Office of the United Kingdom, Combined Search and Examination Report, United Kingdom Patent Application No. GB2314558.4, Mar. 22, 2024, seven pages.

*Primary Examiner* — Calvin C Ma
(74) *Attorney, Agent, or Firm* — Fenwick & West LLP

(57) ABSTRACT

A display device includes a pixel circuit connected to a light emitting element. The pixel circuit includes a driving transistor having a gate electrode, a source electrode, and a drain electrode, and a capacitor connected with the gate electrode. The pixel circuit is driven according to a first period when a reference voltage is applied to the gate electrode, a second period when a gate-source voltage difference of the driving transistor is a threshold voltage of the driving transistor, a third period when the reference voltage is applied to the capacitor, and a voltage of the gate electrode varies due to a coupling phenomenon of the capacitor, a fourth period when a high-potential voltage higher than the reference voltage is applied to the source electrode, and a fifth period when the driving transistor is turned on to cause the light emitting element to emit light.

23 Claims, 6 Drawing Sheets

(56) References Cited

U.S. PATENT DOCUMENTS

2022/0122534 A1  4/2022  Kim
2022/0173189 A1* 6/2022  Kim .................. G09G 3/325

* cited by examiner

DISPLAY DEVICE

CROSS-REFERENCE TO RELATED APPLICATION

This application is a continuation of U.S. patent application Ser. No. 18/468,220 filed on Sep. 15, 2023, which claims priority from Republic of Korea Patent Application No. 10-2022-0124040, filed on Sep. 29, 2022, each of which is hereby incorporated by reference in its entirety.

BACKGROUND

Field

The disclosure relates to a display device and, more specifically, to a display device capable of emitting light at a target luminance without a reduction in luminance when switching from a low to high gradient.

Description of Related Art

Display devices used in computer monitors, televisions TVs, and cell phones include organic light emitting displays (OLEDs), which are self-emissive, and liquid crystal displays (LCDs), which require a separate light source.

Display devices are increasingly being applied not only to computer monitors and televisions, but also to personal mobile devices, and research is underway to develop display devices with large display areas and reduced volume and weight.

Further, in recent years, display devices that include LEDs draw attention as the next-generation display devices. Because LEDs are made of inorganic rather than organic materials, they are more reliable and have a longer lifespan than liquid crystal displays or organic light-emitting diodes. Not only being fast to emit light, but LEDs are also highly luminous, shock-resistant, reliable, and capable of displaying high-brightness images.

SUMMARY

The disclosure aims to provide a display device that reduces luminance reduction when switching from a low- to high-gradient screen.

The disclosure also aims to provide a display device capable of accurate luminance representation by compensating for the degradation of the driving transistor.

Objects of the disclosure are not limited to the foregoing, and other unmentioned objects would be apparent to one of ordinary skill in the art from the following description.

In one embodiment, a display device comprises: a light emitting element; and a pixel circuit connected to the light emitting element, the pixel circuit including a driving transistor having a gate electrode, a source electrode, and a drain electrode, a first transistor including a source electrode connected to a data line and a drain electrode, and a capacitor connected with the gate electrode of the driving transistor and the drain electrode of the first transistor, wherein a driving period of the pixel circuit includes: a first period during which a reference voltage is applied to the gate electrode of the driving transistor; a second period during which a gate-source voltage difference of the driving transistor is a threshold voltage of the driving transistor; a third period during which the reference voltage is applied to the capacitor and a voltage of the gate electrode of the driving transistor varies due to a coupling phenomenon of the capacitor; a fourth period during which a high-potential voltage is applied to the source electrode, the high-potential voltage greater than the reference voltage; and a fifth period during which the driving transistor is turned on and the light emitting element emits light. Accordingly, the display device may mitigate luminance reduction and enhance response speed when the screen is switched from a low to high gradient.

In one embodiment, a display device comprises: a substrate; a pixel circuit disposed on the substrate; and a light emitting element connected to the pixel circuit, the light emitting element including an anode electrode and a cathode electrode, wherein the pixel circuit includes: a driving transistor electrically connected with the light emitting element, the driving transistor including a gate electrode, a source electrode, and a drain electrode; a first capacitor connected to the gate electrode of the driving transistor, the first capacitor including a first electrode and a second electrode; a first transistor configured to apply a data voltage to the second electrode of the first capacitor responsive to being turned on by a first scan signal; a second transistor configured to apply a high-potential voltage to the source electrode of the driving transistor responsive to being turned on by a second scan signal; and a third transistor configured to apply a reference voltage to the second electrode of the first capacitor responsive to being turned on by a light emission signal, wherein the third transistor is on while the second transistor is on. Accordingly, the display device may mitigate luminance reduction and enhance response speed when the screen is switched from a low to high gradient.

In one embodiment, a display device comprises: a driving transistor including a gate electrode of the driving transistor, a first electrode of the driving transistor, and a second electrode of the driving transistor; a light emitting element including an anode electrode and a cathode electrode, the cathode electrode connected to the first electrode of the driving transistor; a first capacitor including a first capacitor electrode and a second capacitor electrode, the second capacitor electrode of the first capacitor connected to the gate electrode of the driving transistor; a first transistor including a gate electrode of the first transistor that is connected to a first scan line that applies a first scan signal to the first transistor, a first electrode of the first transistor that is connected to a data line that applies a data voltage to the first transistor, and a second electrode of the first transistor that is connected to the first capacitor electrode of the first capacitor; and a second capacitor including a first capacitor electrode of the second capacitor and a second capacitor electrode of the second capacitor, the first capacitor electrode of the second capacitor connected to the gate electrode of the driving transistor and the second capacitor electrode of the first capacitor, and the second capacitor electrode of the second capacitor connected to the cathode electrode of the light emitting element and the first electrode of the driving transistor.

Specific details of other embodiments are included in the detailed description and drawings.

According to embodiments of the disclosure, it is possible to mitigate the luminance decay that occurs when switching from a low- to high-gradient screen by driving the pixel circuit according to an initialization period, a sampling period, a coupling period, an OBS period, and a light emission period.

According to embodiments of the disclosure, it is possible to mitigate the luminance decay and accelerate the response by compensating for the decrease in the magnitude of the gate-to-source voltage (|Vgs|) of the driving transistor that occurs in the sampling period prior to the light emission period.

According to embodiments of the disclosure, it is possible to prevent the luminance decay in the light emission period by applying the data voltage and compensating for the hysteresis of the driving transistor before the light emission period.

According to embodiments of the disclosure, it is possible to increase the on-bias stress effects of the driving transistor, along with effective driving suited for the data voltage, by making the magnitude of the reference voltage lower in the initialization period and the coupling period than in the light emission period.

The effects of an embodiment are not limited by the foregoing, and other various effects are included in the disclosure.

BRIEF DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
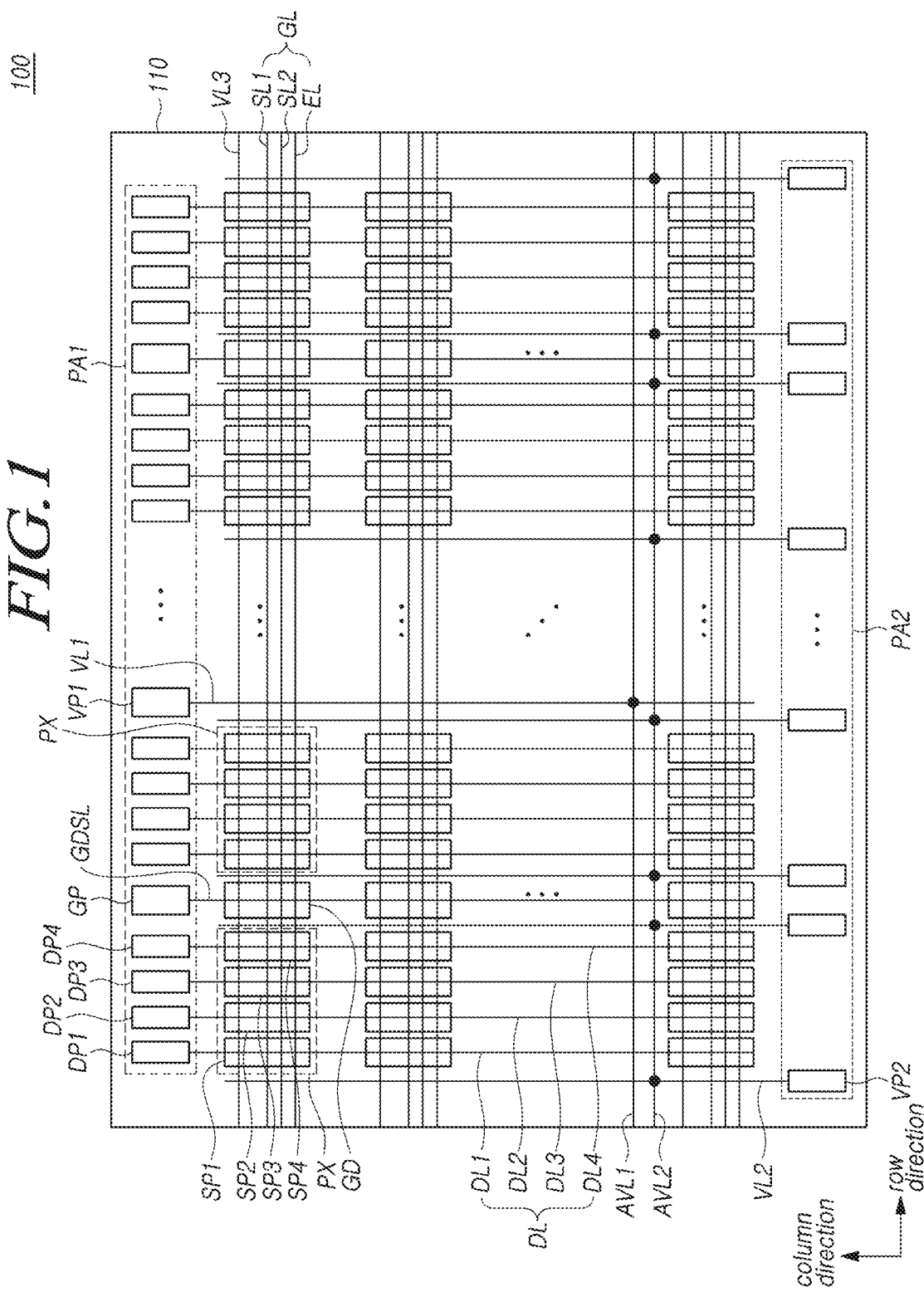
FIG. 1 is a plan view schematically illustrating a display device according to an embodiment of the disclosure.

Advantages and features of the disclosure, and methods for achieving the same may be understood through the embodiments to be described below taken in conjunction with the accompanying drawings. However, the disclosure is not limited to the embodiments disclosed herein, and various changes may be made thereto. The embodiments disclosed herein are provided only to inform one of ordinary skilled in the art of the category of the disclosure. The disclosure is defined only by the appended claims.

The shapes, areas, proportions, angles, and numbers disclosed in the drawings to illustrate embodiments of the disclosure are exemplary and are not intended to limit the disclosure to those shown. The same reference numeral denotes the same element throughout the specification. When determined to make the subject matter of the disclosure unclear, the detailed description of the known art or functions may be skipped. As used herein, when a component "includes," "has," or "is composed of" another component, the component may add other components unless the component "only" includes, has, or is composed of" the other component. As used herein, the singular forms "a," "an," and "the" are intended to include the plural forms as well, unless the context clearly indicates otherwise.

Components are interpreted to include a margin of error, even if not explicitly stated otherwise.

If the description is of a positional relationship, for example, "on", "above", "under", "below", "next to", etc. of two parts, one or more other parts may be located between the two parts, unless "directly" is used.

When an element or layer is referred to as being "on" another element or layer, any layer or other element may be positioned directly on the other element or intervene therebetween.

Although the terms "first" and "second" are used to describe various components, the components are not limited by the terms. These terms are provided simply to distinguish one component from another. Accordingly, the first component mentioned herein may also be the second component within the technical spirit of the disclosure.

The same reference numeral denotes the same element throughout the specification.

The area and thickness of each configuration shown in the drawings are shown for illustrative purposes only, and the disclosure is not necessarily limited to the area and thickness of the configurations shown.

The feature of various embodiments of the disclosure may be partially or wholly combined or coupled with each other, and various technical interlockings and operations are possible, and the embodiments may be practiced independently of each other or in conjunction with each other.

Hereinafter, various embodiments of the disclosure are described in detail with reference to the accompanying drawings.

FIG. 1 is a plan view schematically illustrating a display device 100 according to an embodiment of the disclosure. FIG. 1 illustrates a substrate 110, a plurality of pixels PX, pads, and various lines among the various components of a display device 100 for ease of description.

The substrate 110 is a component for supporting the various components included in the display device 100, and may be formed of an insulating material. For example, the substrate 110 may be formed of, e.g., glass or resin. Further, the substrate 110 may comprise a polymer or plastic, or may be made of a material having flexibility.

The substrate 110 may be divided into a display area and a non-display area. The display area is the area where a plurality of pixels PX are arranged to display the image. The plurality of pixels PX may include at least two or more subpixels. In the drawings, the plurality of pixels PX include, but are not limited to, four subpixels SP1, SP2, SP3, and SP4. The four subpixels include a first subpixel SP1, a second subpixel SP2, a third subpixel SP3, and a fourth subpixel SP4. Hereinafter, one subpixel among the four subpixels is also referred to as SP.

Each of the plurality of subpixels SP is an individual unit that emits light, and a light emitting element 120 and a pixel circuit are disposed in each of the plurality of subpixels SP. The pixel PX including four subpixels SP1, SP2, SP3, and SP4 may include a red subpixel, a green subpixel, a blue subpixel, and a white subpixel, or may include a red subpixel, a green subpixel, a blue subpixel, and a subpixel emitting light in any one of red, green, and blue, but is not limited thereto. The pixel PX may include at least two or more subpixels including a light emitting element having the lowest efficiency among the red light emitting element, the green light emitting element, and the blue light emitting element.

The display device 100 according to an embodiment of the disclosure may include a first subpixel SP1 emitting red light, a second subpixel SP2 emitting red light, a third subpixel SP3 emitting green light, and a fourth subpixel SP4 emitting blue light, and the first subpixel SP1, second subpixel SP2, third subpixel SP3, and fourth subpixel SP4 may be disposed side by side in a row direction.

As mentioned above, the display area is an area where the plurality of pixels PX are disposed, and the non-display area is an area where the image is not displayed, i.e., an area where the plurality of pixels PX are not disposed, and an area where the gate driver GD for the plurality of subpixels SP, various lines, and pads for applying signals to the lines are disposed.

The gate driver GD supplies gate signals to the plurality of pixels PX through the gate lines GL. The gate signals include a first scan signal, a second scan signal, and a light emission signal. The first scan signal is provided through the first scan line SL1, the second scan signal is provided through the second scan line SL2, and the light emission signal is provided through the light emission line EL. The first scan line SL1, the second scan line SL2, and the light emission line EL may be collectively referred to as the gate line GL. Thus, the gate driver GD includes a first scan driver providing the first scan signal, a second scan driver providing the second scan signal, and a light emitting driver providing the light emission signal.

In the display device 100 according to an embodiment of the disclosure, the gate driver GD may be separated into a plurality of areas on the substrate 110 and disposed between the plurality of pixels PX.

In the display device 100 according to an embodiment of the disclosure, the light emitting element may be a light emitting diode (LED). Since the LED has excellent luminous efficiency, the area occupied by the LED relative to the pixel PX may be very small. Accordingly, the gate driver GD, as well as the LED and the pixel circuit driving the LED, may be disposed in one pixel PX.

The gate driver GD may be disposed every two pixels PX to provide a gate signal to the pixels PX disposed in the same row as the gate driver GD. For example, the gate driver GD may be disposed between the blue light emitting subpixel and the red light emitting subpixel. However, without limitations thereto, the arrangement density of the gate driver GD may be changed in some cases.

The first scan driver, the second scan driver, and the light emitting driver included in the gate driver GD may be disposed in the same row, but in different areas.

The data driver converts image data into data signals and supplies the converted data signals to the pixels PX through the data lines DL. The data driver may be formed on the rear surface of the substrate 110 or may be formed on a separate substrate. When the data driver is formed on one surface of a separate substrate, the other surface where the data driver is not formed may face, and be bonded to, the rear surface of the substrate 110. To electrically connect the front and rear surfaces of the substrate 100 or electrically connect the front surface of the substrate 100 and the other surface of the separate substrate, a side line is disposed on a side surface of the substrate 100 or the substrate separate from the substrate 100. Accordingly, the data driver disposed on the rear surface of the substrate 100 or the other surface of the separate substrate may supply data signals to the pixels PX through the sideline.

As described above, in the display device 100 according to an embodiment of the disclosure, the gate driver GD may be disposed between adjacent pixels PX on the substrate 110. However, without limitations thereto, the gate driver GD may be disposed on one side or each of two opposite sides of the substrate 110.

Meanwhile, on the substrate 110, the gate lines GL may be disposed in a row direction, and the data lines DL may be disposed in a column direction. The gate lines GL and the data lines DL are disposed in all the subpixels SP to provide signals to the pixel circuits disposed in the subpixels SP.

Pad areas PA1 and PA2 in which pads are disposed are formed on two opposite sides of the substrate 110, that is, upper and lower portions of the substrate 110 in the column direction, for example. In this case, the pad area formed in an upper portion of the substrate 110 is referred to as a first pad area PA1, and the pad area formed in a lower portion of the substrate 110 is referred to as a second pad area PA2.

In the first pad area PA1, data pads DP1, DP2, DP3, and DP4 connected with data lines DL, gate pads GP connected with the gate driver GD, a high-potential voltage pad VP1 connected with the high-potential voltage line VL1, and a reference voltage pad connected with the reference voltage line VL3 may be disposed. In this case, the number of data pads that are disposed are as many as the number of subpixels SP included in the pixel PX. The data pads may include a first data pad DP1 connected to the first data line DL1, a second data pad DP2 connected to the second data line DL2, a third data pad DP3 connected to the third data line DL3, and a fourth data pad DL4 connected to the fourth data line DL4.

Lines for providing various clock signals, a line for providing the gate low voltage, and a line for providing the gate high voltage may be disposed in the gate driver GD to transfer signals. The gate drivers GD are disposed side by side in the column direction so that various signal transfer lines are aligned with the gate drivers GD. The lines for transferring signals to the gate drivers GD are referred to as gate driver lines GDSL, and the gate driver lines GDSL are disposed in the column direction and connected to the gate pads GP disposed in the first pad area PA1 to receive signals from the gate pads GP.

The high-potential voltage line VL1 may be disposed every pixel PX or every subpixel SP in the column direction. In the drawings, it is illustrated that the high-potential voltage line VL1 is disposed every two pixels PX, but is not limited thereto. The high-potential voltage lines VL1 disposed in the column direction provide the high-potential voltage to the plurality of subpixels SP through the high-potential voltage pads VP1 in the first pad area PA1. The plurality of high-potential voltage lines VL1 disposed in the column direction are connected to auxiliary high-potential voltage lines AVL1 disposed in the row direction to form a mesh structure. The auxiliary high-potential voltage line AVL1 may be disposed every row in which the pixels PX are or every multiple rows. The auxiliary high-potential voltage line AVL1 may prevent or at least reduce the voltage drop of the high-potential voltage line VL1 and provide the high-potential voltage to the plurality of subpixels SP.

The low-potential voltage pads VP2 connected to the low-potential voltage lines VL2 may be disposed in the second pad area PA2.

Al least one low-potential voltage line VL2 may be disposed every pixel PX or every subpixel SP in the column direction. In the drawings, it is illustrated that two low-potential voltage lines VL2 are disposed every two pixels PX, but is not limited thereto. The low-potential voltage lines VL2 disposed in the column direction provide the low-potential voltage to the plurality of subpixels SP through the low-potential voltage pads VP2 in the second pad area PA2. The plurality of low-potential voltage lines VL2 disposed in the column direction are connected to auxiliary low-potential voltage lines AVL2 disposed in the row direction to form a mesh structure. The auxiliary low-potential voltage line AVL2 may be disposed every row in which the pixels PX are or every multiple rows. The auxiliary low-potential voltage line AVL2 may prevent or at least reduce the voltage drop of the low-potential voltage line VL2 and provide the low-potential voltage to the plurality of subpixels SP.

The reference voltage line VL3 may be disposed every pixel row disposed in the row direction. The reference voltage line VL3 disposed in the row direction is connected to the reference voltage pad through a separately disposed column-directed line, and the reference voltage is provided to the plurality of subpixels SP through the reference voltage pad.

A detailed description of the plurality of subpixels SP is described below in greater detail with reference to FIG. 2.

Figure 2:
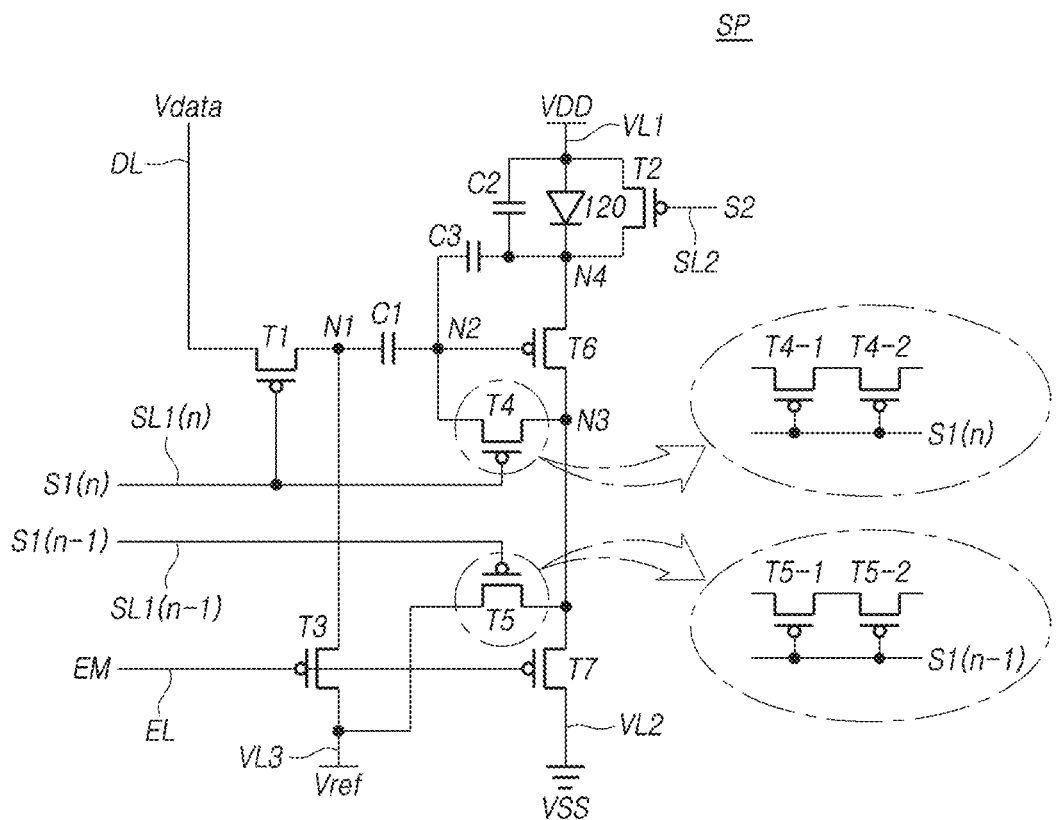
FIG. 2 is a circuit diagram illustrating a light emitting element and a pixel circuit included in a display device according to an embodiment of the disclosure.

FIG. 2 is a circuit diagram illustrating a light emitting element and a pixel circuit included in a display device according to an embodiment of the disclosure. FIG. 2 shows a light emitting element and a pixel circuit included in a subpixel SP disposed in the nth row. In this case, n is a natural number.

Referring to FIG. 2, each of the plurality of subpixels SPs is connected with a first scan line SL1(n), an n−1th first scan line SL1(n−1), a second scan line SL2, a data line DL, an emission line EL, a high-potential voltage line VL1, a low-potential voltage line VL2, and a reference voltage line VL3, and each of the plurality of subpixels SPs includes a pixel circuit including a first transistor T1, a second transistor T2, a third transistor T3, a fourth transistor T4, a fifth transistor T5, a sixth transistor T6, a seventh transistor T7, a first capacitor C1, a second capacitor C2, and a third capacitor C3, and a light emitting element 120 connected to the pixel circuit. In this case, the high-potential voltage line VL1 may be referred to as a first power line, the low-potential voltage line VL2 may be referred to as a second power line, and the reference voltage line VL3 may be referred to as a third power line.

First, the first transistor T1, the second transistor T2, the third transistor T3, the fourth transistor T4, the fifth transistor T5, the sixth transistor T6, and the seventh transistor T7 of the pixel circuit are disposed in each of the plurality of subpixels SPs. Each of the first transistor T1, second transistor T2, third transistor T3, fourth transistor T4, fifth transistor T5, sixth transistor T6, and seventh transistor T7 includes a gate electrode, a source electrode, and a drain electrode.

The first transistor T1, the second transistor T2, the third transistor T3, the fourth transistor T4, the fifth transistor T5, the sixth transistor T6, and the seventh transistor T7 may be N-type transistors or P-type transistors. Since electrons are carriers in the N-type transistor, electrons may flow from the source electrode to the drain electrode, and current may flow from the drain electrode to the source electrode. Since holes are carriers in the P-type transistor, holes may flow from the source electrode to the drain electrode, and current may flow from the source electrode to the drain electrode. For example, one of the plurality of transistors may be an N-type transistor, and another one of the plurality of transistors may be a P-type transistor. The following description assumes that the first transistor T1, second transistor T2, third transistor T3, fourth transistor T4, fifth transistor T5, sixth transistor T6, and seventh transistor T7 are P-type transistors, but is not limited thereto.

The first transistor T1 may include a first gate electrode, a first source electrode, and a first drain electrode. The first gate electrode of the first transistor T1 is connected to the first scan line SL1(n). The first source electrode of the first transistor T1 is connected to the data line DL, and the first drain electrode of the first transistor T1 is connected to the first node N1. The first transistor T1 may transfer the data voltage Vdata from the data line DL to the first node N1 based on the first scan signal S1(n) of the first scan line SL1(n).

The third transistor T3 may include a third gate electrode, a third source electrode, and a third drain electrode. The third gate electrode of the third transistor T3 is connected to the light emission line EL. The third source electrode of the third transistor T3 is connected to the reference voltage line VL3, and the third drain electrode of the third transistor T3 is connected to the first node N1. The third transistor T3 may transfer the reference voltage Vref from the reference voltage line VL3 to the first node N1 according to the light emission signal EM and maintain a constant voltage at the second node N2 while the light emitting element 120 emits light.

The fourth transistor T4 include the fourth gate electrode, the fourth source electrode, and the fourth drain electrode. The fourth gate electrode of the fourth transistor T4 is connected to the first scan line SL1n, the fourth source electrode of the fourth transistor T4 is connected to the second node N2, and the fourth drain electrode of the fourth transistor T4 is connected to the third node N3. The fourth transistor T4 may short the sixth gate electrode and the sixth drain electrode of the sixth transistor T6, and the sixth transistor T6 may be diode-connected. The diode connection is to short the gate and drain electrodes, causing the transistor to behave like a diode.

The fourth transistor T4 may be implemented in a structure in which two transistors are connected in series. The fourth transistor T4 includes a 4-1th transistor T4-1 and a 4-2th transistor T4-2. The gate electrode of the 4-1th transistor T4-1 and the gate electrode of the 4-2th transistor T4-2 are connected to the first scan line SL1(n). The drain electrode or source electrode of the 4-1th transistor T4-1 is connected to the source electrode or drain electrode of the 4-2th transistor T4-2. Both the 4-1th transistor T4-1 and the 4-2th transistor T4-2 are P-type transistors. Since the fourth transistor T4 is implemented with two transistors connected in series, reliability may be enhanced and leakage of current from the sixth gate electrode of the sixth transistor T6 may be minimized or at least reduced.

The fifth transistor T5 includes a fifth gate electrode, a fifth source electrode, and a fifth drain electrode. The fifth gate electrode of the fifth transistor T5 is connected to the n−1th first scan line SL1(n−1). The fifth source electrode of the fifth transistor T5 is connected to the reference voltage line VL3, and the fifth drain electrode of the fifth transistor T5 is connected to the third node N3. The fifth transistor T5 may provide a reference voltage Vref to the third node N3 based on the n−1th first scan signal S1(n−1) of the n−1th first scan line SL(n−1) and may reset the sixth drain electrode of the sixth transistor T6, which is the third node N3, to the reference voltage Vref.

The fifth transistor T5 may be implemented in a structure in which two transistors are connected in series. The fifth transistor T5 includes a 5-1th transistor T5-1 and a 5-2th transistor T5-2. The gate electrode of the 5-1th transistor T5-1 and the gate electrode of the 5-2th transistor T5-2 are connected to the n−1th first scan line SL1(n−1). The drain electrode or source electrode of the 5-1th transistor T5-1 is connected to the source electrode or drain electrode of the 5-2th transistor T5-2. Both the 5-1th transistor T5-1 and the 5-2th transistor T5-2 are P-type transistors. Since the fifth transistor T5 is implemented with two transistors connected in series, reliability may be enhanced and leakage of current from the sixth gate electrode of the sixth transistor T6 may be minimized.

The sixth transistor T6 includes a sixth gate electrode, a sixth source electrode, and a sixth drain electrode. The sixth gate electrode of the sixth transistor T6 is connected to the second node N2. The sixth source electrode of the sixth transistor T6 is connected to the fourth node N4, and the sixth drain electrode of the sixth transistor T6 is connected to the third node N3. The sixth transistor T6 may be turned on to control the driving current flowing to the light emitting element 120, and may be referred to as a driving transistor.

The second transistor T2 includes a second gate electrode, a second source electrode, and a second drain electrode. The second gate electrode of the second transistor T2 is connected to the second scan line SL2. The second source electrode of the second transistor T2 is connected to the high-potential voltage line VL1, and the second drain electrode of the second transistor T2 is connected to the fourth node N4. The second transistor T2 may transfer the high-potential power supply voltage VDD to the fourth node N4 based on the second scan signal S2 of the second scan line SL2. Further, as the second transistor T2 is implemented to be controlled by a signal different from the first transistor T1 or the fourth transistor T4, the second transistor T2 may provide the high-potential power voltage VDD to the fourth node N4 before light emission to increase the gate-source voltage Vgs of the sixth transistor T6 without affecting the voltages of the second node N2 and the third node N3, thereby preventing a reduction in luminance.

The seventh transistor T7 includes a seventh gate electrode, a seventh source electrode, and a seventh drain electrode. The seventh gate electrode of the seventh transistor T7 is connected to the light emission line EL. The seventh source electrode of the seventh transistor T7 is connected to the third node N3, and the seventh drain electrode of the seventh transistor T7 is connected to the low-potential voltage line VL2. The seventh transistor T7 may provide a low-potential power supply voltage to the third node N3 according to the light emission signal EM to allow the driving current to flow.

The first capacitor C1 may include a first capacitor electrode connected to the first node N1 and a second capacitor electrode connected to the second node N2. The first capacitor C1 may fix the voltage applied to the sixth gate electrode of the sixth transistor T6 while the light emitting element 120 emits light, thereby maintaining a constant driving current.

The second capacitor C2 may include a first capacitor electrode connected to the fourth node N4 and a second capacitor electrode connected to the high-potential voltage line VDD. In other words, the second capacitor C2 includes capacitor electrodes connected to the cathode and anode, respectively, of the light emitting element 120. The second capacitor C2 may maintain a constant voltage of the light emitting element 120 so that the light emitting element 120 may emit light while maintaining the same luminance while the same driving current flows.

The third capacitor C3 includes a first capacitor electrode connected to the second node N2 and a second capacitor electrode connected to the fourth node N4. In other words, the third capacitor C3 is a capacitor formed between the sixth gate electrode and the sixth source electrode of the sixth transistor T6 and between the sixth gate electrode and the cathode of the light emitting element 120. Accordingly, the third capacitor C3 may maintain the gate-source voltage of the sixth transistor T6.

Figure 3:
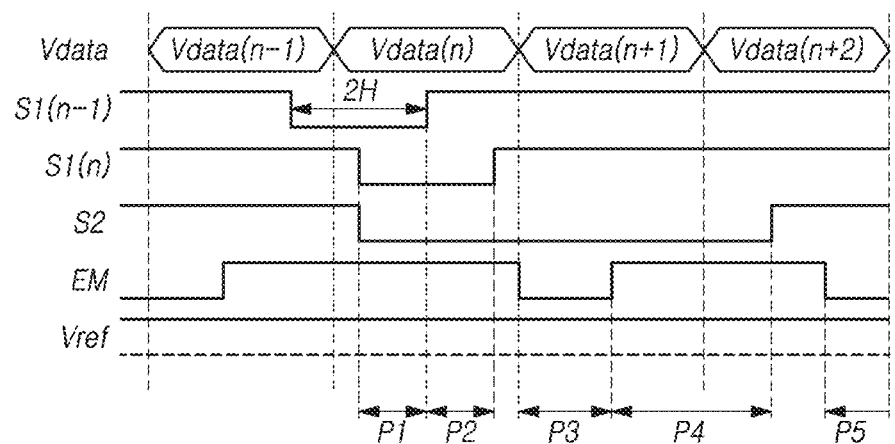
FIGS. 3 and 4 are waveform diagrams illustrating signals provided to a pixel circuit of a display device according to an embodiment of the disclosure.
Figure 4:
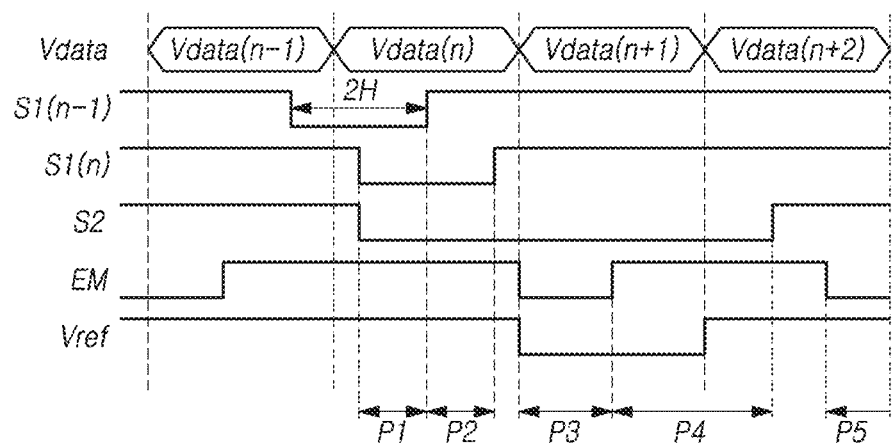

FIGS. 3 and 4 are waveform diagrams illustrating signals provided to a pixel circuit of a display device according to an embodiment of the disclosure. The driving of the pixel circuit is described with reference to FIGS. 2 and 3.

Referring to FIGS. 2 and 3, the driving of the pixel circuit may be divided into a first period P1, a second period P2 that is after the first period P1, a third period P3 that is after the second period P2, a fourth period P4 that is after the third period P3, and a fifth period P5 that is after the fourth period P4. The first period P1 to the fifth period P5 occur sequentially.

Each of the n–1th first scan signal S1(n–1) and the first scan signal S1(n) includes a gate low voltage pulse for two horizontal periods 2H. The second scan signal S2 includes a gate low voltage pulse for at least two horizontal periods 2H, and the light emission signal EM includes a gate high voltage pulse for at least two horizontal periods 2H.

The n–1th first scan signal S1(n–1), the first scan signal S1(n), the second scan signal S2, and the light emission signal EM swing between the gate low voltage and the gate high voltage. The gate low voltage pulse of the n–1th first scan signal S1(n–1) occurs before the gate low voltage pulse of the first scan signal S1(n) and overlaps by about one horizontal period.

The data voltage Vdata provided to the subpixel SP disposed in the nth row is provided while the first scan signal S1(n) is a gate low voltage pulse. The data voltage provided to the subpixel SP disposed in the nth row is denoted as Vdata(n).

The period when the n–1th first scan signal S1(n–1), the first scan signal S1(n), and the second scan signal S2 are all at the gate low voltages is referred to as a first period P1. The first period may be one horizontal period.

During the first period P1, the first transistor T1 is turned on to apply the data voltage Vdata to the first node N1, and the fourth transistor T4 is turned on to connect the second node N2 and the third node N3. Prior to the first period P1, the fifth transistor T5 is turned on so that the reference voltage Vref is applied to the third node N3 and is maintained during the first period P1. Accordingly, the second node N2 and the third node N3 are initialized to the reference voltage Vref. In the first period P1, the second transistor T2 is turned on to connect the anode and the fourth node N4, so that the fourth node N4 is set to the high-potential voltage VDD. The first period P1 may also be referred to as an initialization period.

In the first period P1, the third transistor T3 and the seventh transistor T7 are turned off. In the first period P1, since the second node N2 is the reference voltage Vref and the fourth node N4 is the high-potential voltage VDD, the gate-source voltage Vgs of the sixth transistor T6 is the difference VDD–Vref between the high-potential voltage VDD and the reference voltage Vref. In this case, the high-potential voltage VDD is higher than the reference voltage Vref. Further, the sixth transistor T6 may be turned on, but the light emitting element 120 does not emit light because the seventh transistor T7 is turned off.

The period when the n–1th first scan signal S1(n–1) is a gate high voltage and the first scan signal S1(n) and the second scan signal S2(n) are the gate low voltage is referred to as a second period P2. The second period P2 may be about one horizontal period.

In the second period P2, the fifth transistor T5 is turned off, and the first transistor T1, the second transistor T2, and the fourth transistor T4 maintain a turned-on state. In this case, as the reference voltage Vref applied to the third node N3 is cut off, the sixth transistor T6 is diode-connected through the fourth transistor T4. Accordingly, the threshold voltage of the sixth transistor T6 is sampled at the second node N2. Accordingly, the second period P2 may be referred to as a sampling period.

In the second period P2, the third transistor T3, the fifth transistor T5, and the seventh transistor T7 remain turned off. In the second period P2, since the second node N2 is the sum of the high-potential voltage VDD and the threshold voltage Vth, and the fourth node N4 has the high-potential voltage VDD, the gate-source voltage Vgs of the sixth transistor T6 becomes the threshold voltage Vth of the sixth transistor T6. In the case of the P-type transistor, since the value of the threshold voltage Vth is negative, the gate-source voltage of the sixth transistor T6 in the second period P2 is lower than the gate-source voltage of the sixth transistor T6 in the first period P1.

Further, the sixth transistor T6 may be turned on, but the light emitting element 120 does not emit light because the seventh transistor T7 is turned off.

The period during which the n−1th first scan signal S1(n−1) and the first scan signal S1(n) are gate high voltages, and the second scan signal S2 and the light emission signal EM are gate low voltages is referred to as a third period P3.

In the third period P3, the first transistor T1 and the fourth transistor T4 are turned off, and the third transistor T3 and the seventh transistor T7 are turned on. The fifth transistor T5 maintains a turned-off state, and the second transistor T2 maintains a turned-on state. In this case, as the reference voltage Vref is applied to the first node N1 through the third transistor T3, the voltage at the second node N2 is reduced due to the coupling of the first capacitor C1. Accordingly, the third period P3 may also be referred to as a coupling period. The voltage of the second node N2 is reduced by the difference between the reference voltage Vref and the data voltage Vdata.

Subsequently, the period during which the n−1th first scan signal S1(n−1) and the first scan signal S1(n) are gate high voltages, the second scan signal S2 is a gate low voltage, and the light emission signal EM is switched from the gate low voltage to the gate high voltage is referred to as a fourth period P4.

In the fourth period P4, the third transistor T3 and the seventh transistor T7 are turned off, and the first transistor T1, the fourth transistor T4, and the fifth transistor T5 maintain the turned-off state, and the second transistor T2 maintains the turned-on state. A high-potential voltage VDD is applied to the fourth node N4 through the second transistor T2. In this case, the sixth transistor T6 is turned on by the voltage applied to the gate electrode of the sixth transistor T6 in the third period P3 and the voltage applied to the source electrode of the sixth transistor T6 in the fourth period P4 and enters an on-bias stress (OBS) state. It is possible to mitigate luminance reduction and unwanted hysteresis effects experienced by the sixth transistor T6 in the on-bias stress state. Accordingly, the fourth period P4 may also be referred to as a coupling period. The absolute value of the gate-source voltage of the sixth transistor T6, which was reduced in the second period P2, may be increased in the third period P3 and the fourth period P4 before light emission, and the threshold voltage characteristics of the sixth transistor T6 are synchronized, so that it is possible to enhance the response speed and mitigate the luminance decay due to a sharp change in the gate-source voltage of the sixth transistor T6 during emission.

The period during which the n−1th first scan signal S1(n−1), the first scan signal S1(n), and the second scan signal S2 are gate high voltages, and the light emission signal EM is a gate low voltage is referred to as a fifth period P5.

In the fifth period P5, the third transistor T3, the sixth transistor T6, and the seventh transistor T7 are turned on, and the second transistor T2 is turned off. The first transistor T1, the fourth transistor T4, and the fifth transistor T5 maintain the turned-off state. In this case, as the seventh transistor T7 is turned on, the low-potential voltage VSS is applied to the drain electrode of the sixth transistor T6 so that the sixth transistor T6 is turned on, and a driving current is provided to the light emitting element 120, causing the light emitting element 120 to emit light. Accordingly, the fifth period P5 may also be referred to as an emission period. In the fifth period P5, the reference voltage Vref provided through the third transistor T3 is maintained at the first node N1, and the voltage of the fourth node N4, changed by the driving current $I_D$, is coupled with the second node N2 through the third capacitor C3. Here, the fourth node N4 and the second node N2 are capacitively coupled through the third capacitor C3. Accordingly, when a voltage change occurs at the fourth node N4, the voltage of the second node N2 capacitively coupled to the fourth node N4 may have a change corresponding to the voltage change at the fourth node N4. This phenomenon may be referred to as a coupling phenomenon of the third capacitor C3.

Accordingly, during the emission period, the first capacitor C1 and the third capacitor C3 maintain the voltage of the second node N2 constant, so that the sixth transistor T6 may provide a constant driving current to the light emitting element 120. Further, as the second capacitor C2 maintains a constant voltage of the light emitting element 120, the light emitting element 120 may emit light while maintaining the same luminance.

In the fifth period P5, the gate voltage of the sixth transistor T6 is VDD+Vth−Vdata+Vref and the source voltage is VDD, so that the driving current $I_D$ of the sixth transistor T6 is equal to Equation 1.

$$I_D = k\{VDD - (VDD + Vth - Vdata + Vref) - |Vth|\}^2 = k(Vdata - Vref)^2 \quad \text{[Equation 1]}$$

In Equation 1, k is a constant value for the characteristics of the driving element. Referring to Equation 1, the value of the threshold voltage Vth of the sixth transistor T6 is removed from the driving current $I_D$, so that the driving current $I_D$ does not depend on the threshold voltage Vth of the sixth transistor T6 and is not affected by changes in the threshold voltage Vth. In this case, the sixth transistor T6 is a P-type transistor.

In FIG. 3, the reference voltage Vref is maintained at the same voltage in the first period P1 to the fifth period P5.

When the reference voltage Vref is maintained at the same voltage in the first period P1 to the fifth period P5, as illustrated in FIG. 3, the reference voltage Vref may remain constant at a second reference voltage level, which is the higher of a first reference voltage level and the second reference voltage level.

Alternatively, the reference voltage Vref may vary between the first reference voltage level and the second reference voltage level during the first period P1 to the fifth period P5.

In FIG. 4, only the waveform of the reference voltage Vref differs from that of FIG. 3 while the data voltage Vdata, n−1th first scan signal S1(n−1), the first scan signal S1(n−1), the second scan signal S2, and the light emission signal EM have the same waveforms as those in FIG. 3. Thus, the description made in connection with FIG. 4 focuses primarily on the reference voltage Vref with the same waveforms as those shown in FIG. 3 omitted therefrom.

Referring to FIG. 4, the reference voltage Vref applied to the pixel circuit included in the display device according to an embodiment of the disclosure is maintained at the first reference voltage level during the third period P3 and the fourth period P4, and is maintained at the second reference voltage level in the first period P1, the second period P2, and the fifth period P5. The first reference voltage is a voltage that is less than the second reference voltage. The first reference voltage is a low voltage for increasing the on-bias stress effect of the sixth transistor T6, and the second reference voltage is a high voltage suitable for the data voltage range. In Equation 1, which is an equation for driving current, the reference voltage Vref is a value corresponding to the second reference voltage, and the range of the data voltage Vdata may be adjusted using the reference voltage Vref.

The structure of the subpixel SP of the display device 100 according to an embodiment of the disclosure is described below with reference to FIGS. 5 and 6.

Figure 5:
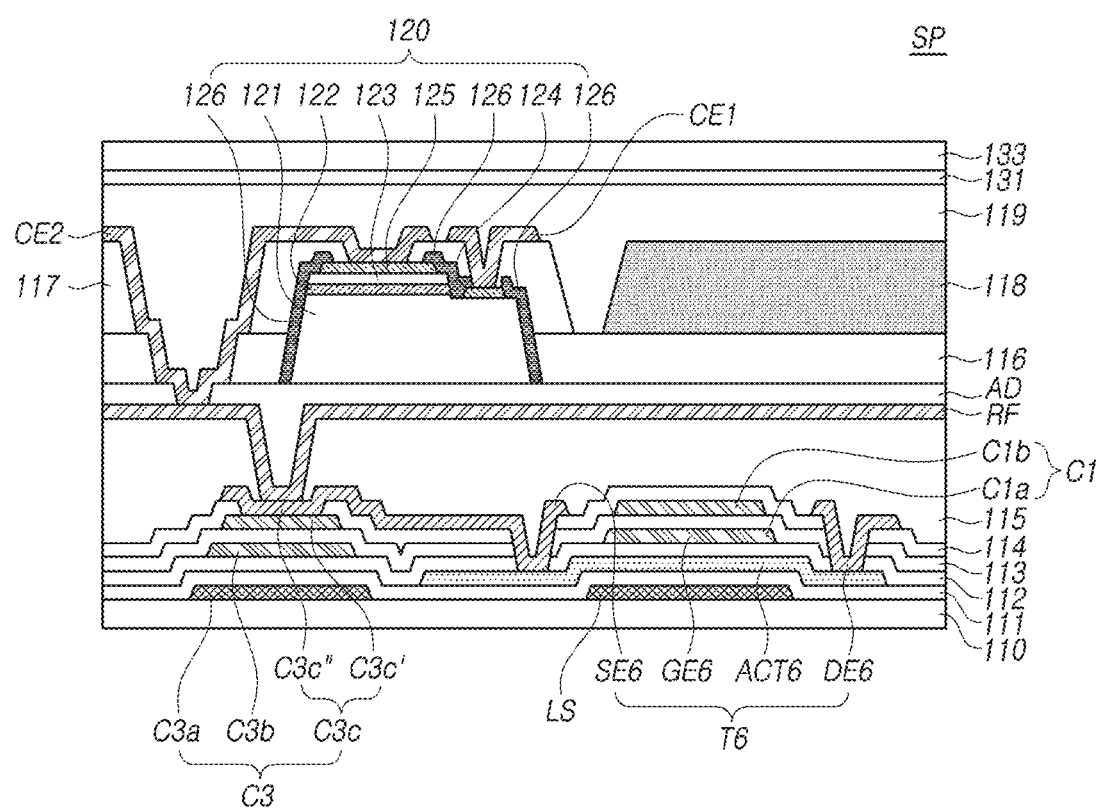
FIG. 5 is a cross-sectional view illustrating a portion of a subpixel included in a display device according to an embodiment of the disclosure.

FIG. 5 is a cross-sectional view illustrating a portion of a subpixel SP included in a display device according to an embodiment of the disclosure. Specifically, FIG. 5 illustrates a light emitting element 120, a sixth transistor T6, and a third capacitor C3 disposed in a subpixel SP.

Referring to FIGS. 5 and 2 together, a light blocking layer LS is disposed on each of the plurality of subpixels SP on the substrate 110. The light blocking layer LS blocks light incident from under the substrate 110 to the active layers of the plurality of transistors, thereby reducing leakage current. For example, the light blocking layer LS may be disposed under the sixth active layer ACT6 of the sixth transistor T6 that functions as a driving transistor, and may block the light incident on the sixth active layer ACT6. If the sixth active layer ACT6 is irradiated with light, leakage current may occur, deteriorating reliability of the sixth transistor T6. Accordingly, the reliability of the sixth transistor T6 may be enhanced by disposing the light blocking layer LS for blocking light on the substrate 110. The light blocking layer LS may be formed of an opaque conductive material, such as copper (Cu), aluminum (Al), molybdenum (Mo), nickel (Ni), titanium (Ti), chromium (Cr) or an alloy thereof, but is not limited thereto.

A buffer layer 111 is disposed on the light blocking layer LS. The buffer layer 111 may reduce penetration of moisture or impurities through the substrate 110. The buffer layer 111 may include, e.g., a single layer or multiple layers of silicon oxide (SiOx) or silicon nitride (SiNx), but is not limited thereto. However, the buffer layer 111 may be omitted depending on the type of substrate 110 or the type of thin film transistor, but is not limited thereto.

A sixth transistor T6 including a sixth active layer ACT6, a sixth gate electrode GE6, a sixth source electrode SE6 and a sixth drain electrode DE6 is disposed on the buffer layer 111.

A sixth active layer ACT6 is disposed on the buffer layer 111. The sixth active layer ACT6 may be formed of a semiconductor material, such as an oxide semiconductor, amorphous silicon or polysilicon, but is not limited thereto.

A gate insulation layer 112 is disposed on the sixth active layer ACT6, and a sixth gate electrode GE6 is disposed on the gate insulation layer 112. The sixth gate electrode GE6 is connected to the capacitor electrode of the first capacitor C1 and the fourth transistor T4. The sixth gate electrode GE6 may be formed of an opaque conductive material, such as copper (Cu), aluminum (Al), molybdenum (Mo), nickel (Ni), titanium (Ti), chromium (Cr) or an alloy thereof, but is not limited thereto.

A first inter-layer insulation layer 113 and a second inter-layer insulation layer 114 are disposed on the sixth gate electrode GE6, and a sixth source electrode SE6 and a sixth drain electrode DE6 electrically connected to the sixth active layer ACT6 are disposed on the second inter-layer insulation layer 114. The sixth source electrode SE6 is connected to the second capacitor C2, the third capacitor C3, and the cathode electrode 125 of the light emitting element 120. The sixth drain electrode DE6 is connected to the fifth transistor T5 and the seventh transistor T7. The sixth source electrode SE6 and the sixth drain electrode DE6 may be formed of an opaque conductive material, such as copper (Cu), aluminum (Al), molybdenum (Mo), nickel (Ni), titanium (Ti), chromium (Cr) or an alloy thereof, but is not limited thereto.

A third capacitor C3 is disposed on the substrate 110. The third capacitor C3 may include a 3-1th capacitor electrode C3a, a 3-2th capacitor electrode C3b, and a 3-3th capacitor electrode C3c. The third capacitor C3 may include a 3-1th capacitor electrode C3a as a lower capacitor electrode, a 3-2th capacitor electrode C3b as an intermediate capacitor electrode, and a 3-3th capacitor electrode C3c as an upper capacitor electrode.

A 3-1th capacitor electrode C3a is disposed on the substrate 110. The 3-1th capacitor electrode C3a is a portion extending from the light blocking layer LS and may be integrally formed with the light blocking layer LS. In this case, the 3-1th capacitor electrode C3a may be electrically connected to the second capacitor C2 and the sixth source electrode SE6 through contact holes formed in the buffer layer 111 and the gate insulation layer 112.

A 3-2th capacitor electrode C3b is disposed on the buffer layer 111 and the gate insulation layer 112. The 3-2th capacitor electrode C3b is a portion extending from the sixth gate electrode GE6 and may be disposed to overlap the 3-1th capacitor electrode C3a. The 3-2th capacitor electrode C3b may be electrically connected to the sixth gate electrode GE6 and the six source electrode SE6 of the sixth transistor T6.

A 3-3th capacitor electrode C3c is disposed on the first inter-layer insulation layer 113. The 3-3th capacitor electrode C3c may include a first layer C3c' and a second layer C3c''. The first layer C3c' of the 3-3th capacitor electrode C3c may have an island-shaped pattern formed of the same material on the same layer as the capacitor electrode included in the first capacitor C1. The first layer C3c' may be disposed to overlap the 3-1th capacitor electrode C3a and the 3-2th capacitor electrode C3b with the first inter-layer insulation layer 113 interposed therebetween.

The second layer C3c'' of the 3-3th capacitor electrode C3c is disposed on the second inter-layer insulation layer 114. The second layer C3c'' is a portion extending from the sixth source electrode SE6 and may be connected to the first layer C3c' through the contact hole of the second inter-layer insulation layer 114.

Meanwhile, a first scan line SL1(n), a second scan line SL2, and a light emission line EL are disposed on the gate insulation layer 112. The first scan line SL1(n), the second scan line SL2, and the light emission line EL extend in the row direction and may be disposed along a plurality of subpixels SP disposed in the same row. Further, the plurality of subpixels SP included in the nth row receive the scan signal of the n−1th first scan line SL1(n−1) disposed in the n−1th row. In other words, the n−1th first scan line SL1(n−1) is the first scan line SL1 disposed in the n−1th row.

The first scan line SL1(n) may be integrated with the first gate electrode and the fourth gate electrode to transfer the first scan signal S1(n) to the first transistor T1 and the fourth transistor T4, turning on or off the first transistor T1 and the fourth transistor T4. The second scan line SL2 may be integrated with the second gate electrode to transfer the second scan signal S2 to the second transistor T2, turning on or off the second transistor T2. The light emission line EL may be integrated with the third gate electrode and the seventh gate electrode to transfer the light emission signal EM to the third transistor T3 and the seventh transistor T7, turning on or off the third transistor T3 and the seventh transistor T7. Further, the n−1th first scan line SL1(n−1) may be integrated with the fifth gate electrode to transfer the n−1th first scan signal S1(n−1) to the fifth transistor T5, turning on or off the fifth transistor T5.

A reference voltage line VL3 may be disposed on the first inter-layer insulation layer 113. The reference voltage line VL3 may extend in the row direction and may be disposed along a plurality of subpixels SP disposed in the same row.

A data line DL, a high-potential voltage line VL1, and a low-potential voltage line VL2 are disposed on the second inter-layer insulation layer 114. The data line DL, the high-potential voltage line VL1 and the low-potential voltage line VL2 may extend in the column direction and may be disposed along a plurality of subpixels SP disposed in the same column.

A passivation layer 115 may be disposed on the first transistor T1, the second transistor T2, the third transistor T3, the fourth transistor T4, the fifth transistor T5, the sixth transistor T6, the seventh transistor T7, the first capacitor C1, the second capacitor C2, and the third capacitor C3. The passivation layer 115 is an insulation layer for protecting the components under the passivation layer 115, and may be formed of either an inorganic material, such as silicon oxide (SiOx) or silicon nitride (SiNx), or an organic material, such as benzocyclobutene or acrylic, but is not limited thereto.

Figure 6:
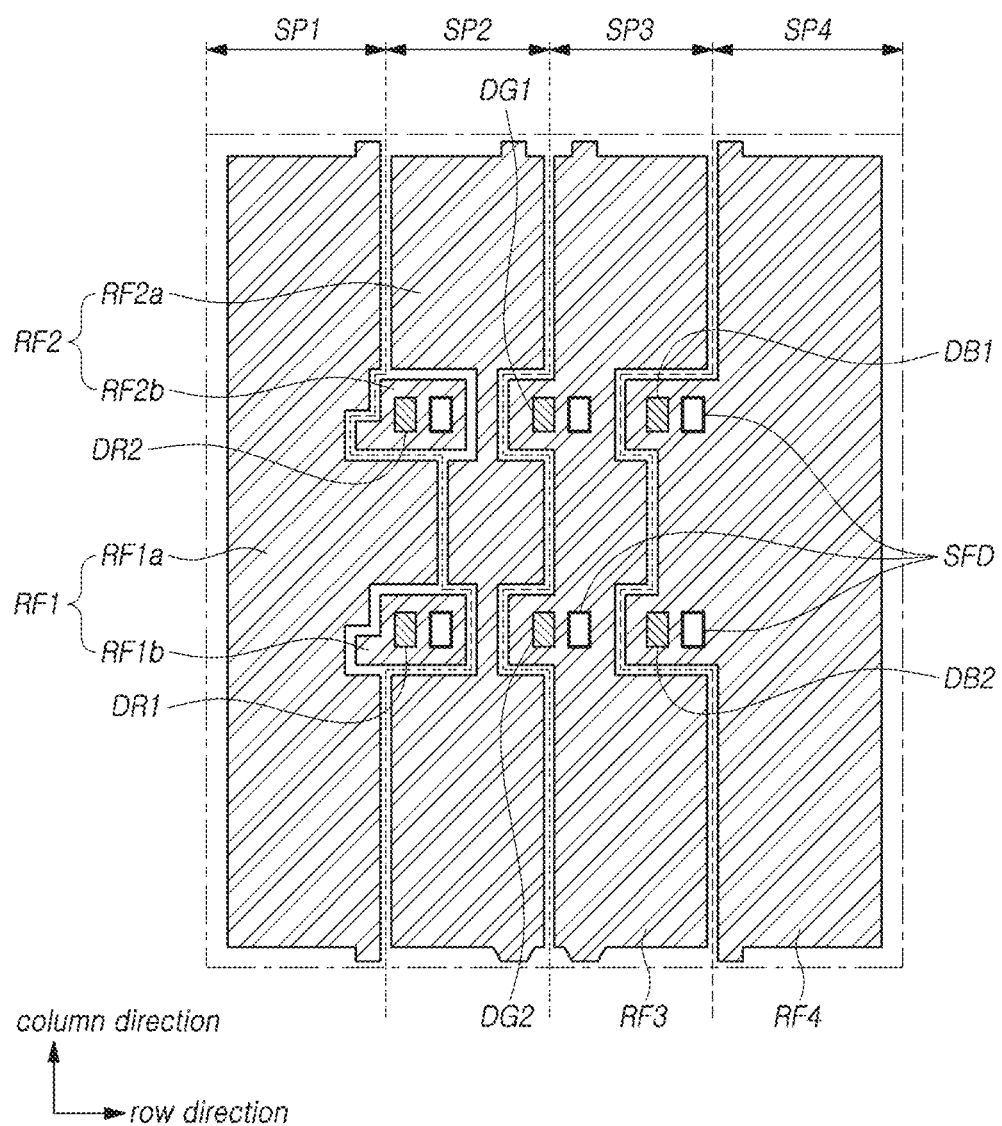
FIG. 6 is a plan view illustrating a reflector and a light emitting element of a plurality of subpixels of a display device according to an embodiment of the disclosure.

FIG. 6 is a plan view illustrating a reflector and a light emitting element of a plurality of subpixels of a display device according to an embodiment of the disclosure.

Referring to FIGS. 6 and 5 together, a reflector RF is disposed on the passivation layer 115. The reflector RF reflects the light emitted from the light emitting element 120 upward of the substrate 110 and may be formed in a shape corresponding to each of a plurality of subpixels SP. One reflector RF may be disposed to cover most of the area of one subpixel SP.

For example, if the plurality of subpixels SPs include a first subpixel SP1, a second subpixel SP2, a third subpixel SP3, and a fourth subpixel SP4 disposed in the same row, the reflectors RF may include a first reflector RF1 corresponding to the first subpixel SP1, a second reflector RF2 corresponding to the second subpixel SP2, a third reflector RF3 corresponding to the third subpixel SP3, and a fourth reflector RF4 corresponding to the fourth subpixel SP4.

The first reflector RF1 may include a 1-1th reflector RF1a overlapping most (e.g., a majority) of the first subpixel SP1 and a 1-2th reflector RF1b overlapping the light emitting element 120 of the first subpixel SP1. The 1-1th reflector RF1a is electrically connected to the cathode electrode 125 of the light emitting element 120, the sixth source electrode SE6 of the sixth transistor T6, and the third capacitor C3 and may be used to repair the first subpixel SP1 while simultaneously reflecting the light emitted from the light emitting element 120 upward of the light emitting element 120. When the first subpixel SP1 is defective, the first subpixel SP1 may be repaired by electrically connecting the 1-1th reflector RF1a connected to the cathode electrode 125 of the light emitting element 120 with the 1-1th reflector RF1a of the first subpixel SP1 in the adjacent row. The 1-2th reflector RF1b may reflect the light emitted from the light emitting element 120 upward of the light emitting element 120.

The second reflector RF2 includes a 2-1st reflector RF2a overlapping most of the second subpixel SP2 and a 2-2nd reflector RF2b overlapping the light emitting element 120 of the second subpixel SP2. The 2-1th reflector RF2a is electrically connected to the cathode electrode 125 of the light emitting element 120, the sixth source electrode SE6 of the sixth transistor T6, and the third capacitor C3 and may be used to repair the second subpixel SP2 while simultaneously reflecting the light emitted from the light emitting element 120 upward of the light emitting element 120. Specifically, when the second subpixel SP2 is defective, the second subpixel SP2 may be repaired by electrically connecting the 2-1th reflector RF2a with the 2-1th reflector RF2a of the second subpixel SP2 of the neighboring row. The 2-2th reflector RF2b may reflect the light emitted from the light emitting element 120 upward of the light emitting element 120.

The third reflector RF3 may include one third reflector RF3 overlapping the entire third subpixel SP3. The third reflector RF3 is electrically connected to the cathode electrode 125 of the light emitting element 120 of the third subpixel SP3, the sixth source electrode SE6 of the sixth transistor T6, and the third capacitor C3 and may be used to repair the third subpixel SP3 while simultaneously reflecting the light emitted from the light emitting element 120 upward of the light emitting element 120. When the third subpixel SP3 is defective, the third subpixel SP3 may be repaired by electrically connecting the third reflector RF3 with the third reflector RF3 of the third subpixel SP3 of the neighboring row.

The fourth reflector RF4 may include one fourth reflector RF4 overlapping the entire fourth subpixel SP4. The fourth reflector RF4 is electrically connected to the cathode electrode 125 of the light emitting element 120 of the fourth subpixel SP4, the sixth source electrode SE6 of the sixth transistor T6, and the third capacitor C3 and may be used to repair the fourth subpixel SP4 while simultaneously reflecting the light emitted from the light emitting element 120 upward of the light emitting element 120. When the fourth subpixel SP4 is defective, the fourth subpixel SP4 may be repaired by electrically connecting the fourth reflector RF4 with the fourth reflector RF4 of the fourth subpixel SP4 of the neighboring row.

While it has been described that the first subpixel SP1 and the second subpixel SP2 comprise two reflectors RF, and the third subpixel SP3 and the fourth subpixel SP4 comprises one reflector RF, the reflectors RF may be variously designed to include a reflector RF connected to the cathode electrode 125 of the light emitting element 120. For example, only one reflector RF may be disposed in all of the plurality of subpixels SP, like the third subpixel SP3 and the fourth subpixel SP4, or a plurality of reflectors RF may be disposed like the first subpixel SP1 and the second subpixel SP2, but embodiments of the disclosure are not limited thereto.

Referring to FIG. 5, an adhesive layer AD is disposed on the reflector RF. The adhesive layer AD is a layer for fixing (e.g., attaching or connecting) the light emitting element 120 disposed on the adhesive layer AD, and may be formed of an adhesive material, such as resin, but is not limited thereto.

The light emitting element 120 is disposed on the adhesive layer AD. The light emitting element 120 is an element that emits light by current and may include a light emitting element 120 that emits red light, green light, blue light, or light of various colors including white, as a combination thereof. For example, the light emitting element 120 may be a light emitting diode (LED) or a micro LED, but is not limited thereto.

The light emitting element 120 includes a first semiconductor layer 121, a light emitting layer 122, a second semiconductor layer 123, an anode electrode 124, a cathode electrode 125, and a passivation film 126.

The first semiconductor layer 121 is disposed on the adhesive layer AD, and the second semiconductor layer 123 is disposed on the first semiconductor layer 121. The first semiconductor layer 121 and the second semiconductor layer 123 may be layers formed by doping a specific material with n-type and p-type impurities. For example, the first semiconductor layer 121 and the second semiconductor layer 123 may be layers formed by doping a material, such as gallium nitride (GaN), indium aluminum phosphide (InAlP), or gallium arsenide (GaAs), with p-type or n-type impurities. The p-type impurities may be magnesium (Mg), zinc (Zn), or beryllium (Be), and the n-type impurities may be silicon (Si), germanium (Ge), or tin (Sn), but are not limited thereto.

The light emitting layer 122 is disposed between the first semiconductor layer 121 and the second semiconductor layer 123. The light emitting layer 122 may emit light by receiving holes and electrons from the first semiconductor layer 121 and the second semiconductor layer 123. The light emitting layer 122 may have a single-layer or multi-quantum well (MQW) structure and may be formed of, e.g., indium gallium nitride (InGaN) or gallium nitride (GaN), but is not limited thereto.

An anode electrode 124 is disposed on the first semiconductor layer 121, and a cathode electrode 125 is disposed on the second semiconductor layer 123. In this case, to dispose the anode electrode 124 on the first semiconductor layer 121, the first semiconductor layer 121 may partially protrude from the light emitting layer 122 and the second semiconductor layer 123. The anode electrode 124 may be formed on a portion of the upper surface of the first semiconductor layer 121 protruding from the light emitting layer 122 and the second semiconductor layer 123, and the cathode electrode 125 may be formed on the upper surface of the second semiconductor layer 123.

Meanwhile, the passivation film 126 surrounding the light emitting element 120 may cover at least a side surface of the first semiconductor layer 121, a side surface of the light emitting layer 122, and a side surface of the second semiconductor layer 123 of the light emitting element 120 among the outer surfaces of the light emitting element 120. The passivation film 126 surrounding the light emitting element 120 may be formed to prevent electrical shorting of the first semiconductor layer 121 and the second semiconductor layer 123 when forming the anode electrode 124 and the cathode electrode 125.

The plurality of pixels PX may include at least one subpixel SP in which a main light emitting element and an auxiliary light emitting element are disposed. For example, each of the first subpixel SP1 and the second subpixel SP2 may include only one light emitting element. The first subpixel SP1 may include a red main light emitting element DR1. The second subpixel SP2 may include a red main light emitting element DR2. In this case, the red main light emitting element DR2 included in the second subpixel SP2 may be referred to as a redundancy light emitting element. Each of the third subpixel SP3 and the fourth subpixel SP4 may include a main light emitting element and an auxiliary light emitting element. The third subpixel SP3 may include a green main light emitting element DG1 and a green auxiliary light emitting element DG2. The fourth subpixel SP4 may include a blue main light emitting element DB1 and a blue auxiliary light emitting element DB2. In this case, the green auxiliary light emitting element DG2 and the blue auxiliary light emitting element DB2 may be referred to as a redundant light emitting element.

The plurality of pixels PX may include at least one subpixel SP having a light emitting element site SFD, which is an empty space where a light emitting element may be disposed. When the main light emitting element and/or the auxiliary light emitting element are defective, an additional light emitting element may be disposed in the light emitting element site SFD. For example, each of the first subpixel SP1 and the second subpixel SP2 may include one light emitting element site SFD. The first subpixel SP1 and the second subpixel SP2 have light emitting element sites SFD disposed adjacent to the red main light emitting elements DR1 and DR2, respectively. Each of the third subpixel SP3 and the fourth subpixel SP4 may include two light emitting element sites SFD. The third subpixel SP3 has the light emitting element sites SFD in an area adjacent to the green main light emitting element DG1 and an area adjacent to the green auxiliary light emitting element DG2. The fourth subpixel SP4 has the light emitting element sites SFD in an area adjacent to the blue main light emitting element DB1 and an area adjacent to the blue auxiliary light emitting element DB2.

A planarization layer including a first planarization layer 116 and a second planarization layer 117 is disposed on the light emitting element 120 and the adhesive layer AD. The planarization layer may planarize an upper portion of the substrate 110 where the light emitting element 120 is disposed and fix and protect the light emitting element 120. Each of the first planarization layer 116 and the second planarization layer 117 may be composed of a single layer or a multi-layer structure and be formed of, e.g., benzocyclobutene or acryl-based organic material, but is not limited thereto.

A connection electrode CE connecting the light emitting element 120 to the pixel circuit and the high-potential voltage line VL1 is disposed on the planarization layer. The connection electrode CE may include an anode connection electrode CE1 and a cathode connection electrode CE2.

The anode connection electrode CE1 is an electrode that electrically connects the anode electrode 124 of the light emitting element 120 and the high-potential voltage line VL1. The anode connection electrode CE1 may be connected to the anode electrode 124 of the light emitting element 120 through a contact hole formed in the second planarization layer 117.

The cathode connection electrode CE2 is an electrode that electrically connects the cathode electrode 125 of the light emitting element 120, the sixth source electrode SE6 of the sixth transistor T6, the third capacitor C3, and the second capacitor C2. The cathode connection electrode CE2 may be connected to the reflector RF of each of the plurality of subpixels SP through contact holes formed in the adhesive layer AD, the first planarization layer 116, and the second planarization layer 117. In this case, since the reflector RF is connected to the sixth source electrode SE6 of the sixth transistor T6, the third capacitor C3, and the second capacitor C2, the sixth source electrode SE6 of the sixth transistor T6, the third capacitor C3, and the second capacitor C2 and the cathode electrode 125 of the light emitting element 120 may be electrically connected through the reflector RF and the cathode connection electrode CE2.

A bank 118 is disposed on the planarization layer. As shown in the drawings, the bank 118 may be disposed on the first planarization layer 116 exposed from the second planarization layer 117 of the planarization layer, and may be disposed on the second planarization layer 117, but is not limited thereto. The bank 118 may be formed of an opaque material to reduce color mixing between the plurality of subpixels SP. For example, the bank 118 may be formed of black resin, but is not limited thereto.

A protection layer 119 is disposed on the connection electrode CE and the bank 118. The protection layer 119 is a layer for protecting the structure under the protection layer 119, and may be composed of a single layer or multiple layers of light transmitting epoxy, silicon oxide (SiOx) or silicon nitride (SiNx), but is not limited thereto.

A protection film 133 is disposed on the protection layer 119. The protection film 133 is attached to the protection layer 119 through the adhesive film 131. The protection film 133 may be an anti-shattering film that may protect the structure under the protection film 133 and prevent fragments from scattering when the structure under the protection film 133 is broken. The protection film 133 may be an optical film formed of an inorganic material, such as PET, and the protection film 133 and the adhesive film 131 may be laminated together and be attached onto the protection layer 119. The adhesive film 131 is formed of a transparent optical adhesive material. For example, the adhesive film 131 may be an optically clear adhesive (OCA) in a film form or an optically clear resin (OCR) in an amorphous liquid form, but is not limited thereto.

A display device according to embodiments of the disclosure may be described as follows.

A display device according to an embodiment of the disclosure includes a pixel circuit including a driving transistor having a light emitting element and a gate electrode, a source electrode, and a drain electrode and a capacitor connected with the gate electrode. In this case, the pixel circuit is driven according to a first period when a reference voltage is applied to the gate electrode, a second period when a gate-source voltage difference of the driving transistor is a threshold voltage of the driving transistor, a third period when the reference voltage is applied to the capacitor, and a voltage of the gate electrode is varied due to a coupling phenomenon of the capacitor, a fourth period when a high-potential voltage higher than the reference voltage is applied to the source electrode, and a fifth period when the driving transistor is turned on to cause the light emitting element to emit light.

The above-mentioned "capacitor coupling phenomenon" is described below. When the capacitor includes a first electrode (first capacitor electrode) connected with the gate electrode of the driving transistor and a second electrode (second capacitor electrode) connected with the point where the reference voltage is applied (reference voltage applied point e.g., the first node N1), the gate electrode and the reference voltage applied point are capacitively coupled through the capacitor. Accordingly, if a voltage variation occurs at either the gate electrode or the reference voltage applied point (e.g., the reference voltage applied point or the first node N1 of FIG. 2), another voltage variation corresponding to the voltage variation may also occur at the other (e.g., the gate electrode of the driving transistor or the second node N2 of FIG. 2). This phenomenon may be referred to as a coupling phenomenon of a capacitor.

According to another feature of the disclosure, the gate-source voltage difference of the driving transistor in the second period may be smaller than the gate-source voltage difference of the driving transistor in the first period, and the gate-source voltage difference of the driving transistor in the fourth period may be larger than the gate-source voltage difference of the driving transistor in the second period.

According to another feature of the disclosure, the voltage of the gate electrode in the third period may be lower than the voltage of the gate electrode in the second period.

According to another feature of the disclosure, the pixel circuit may include a transistor connected with the reference voltage line providing the reference voltage. The transistor may be controlled by the light emission signal. Further, the light emission signal may turn on the transistor in the third period and the fifth period.

According to another feature of the disclosure, the light emitting element may include an N-type semiconductor material layer and a P-type semiconductor material layer. The N-type semiconductor material layer may be connected to the source electrode. The P-type semiconductor material layer may be connected to a high-potential voltage line where a high-potential voltage is provided.

According to another feature of the disclosure, the drain electrode may be electrically connected to a low-potential voltage line where a low-potential voltage lower than the high-potential voltage is provided.

According to another feature of the disclosure, the reference voltage may be a first reference voltage in the first period and the third period and be a second reference voltage higher than the first reference voltage in the fifth period.

A display device according to another embodiment of the disclosure includes a substrate, a pixel circuit disposed on the substrate, and a light emitting element disposed on the pixel circuit and having an anode electrode and a cathode electrode. In this case, the pixel circuit includes a driving transistor electrically connected with a light emitting element and including a gate electrode, a source electrode, and a drain electrode, a first capacitor connected to the gate electrode and including a first electrode (corresponding to the second node N2 of FIG. 2) and a second electrode (corresponding to the first node N1 of FIG. 2), a first transistor turned on by a first scan signal to provide a data voltage to the second electrode (corresponding to the first node N1 of FIG. 2) of the first capacitor, a second transistor turned on by a second scan signal to apply a high-potential voltage to the source electrode, and a third transistor turned on by a light emission signal to provide a reference voltage to the second electrode.

In a display device according to another embodiment of the disclosure, the light emission signal for turning on the third transistor overlaps the second scan signal for turning on the second transistor. Here, that the light emission signal overlaps the second scan signal may mean that the signal period for turning on the third transistor in the light emission signal temporally overlaps the signal period for turning on the second transistor in the second scan signal.

According to another feature of the disclosure, the anode electrode may be connected with the high-potential voltage line providing the high-potential voltage, and the drain electrode may be electrically separated from or connected to the low-potential voltage line where the low-potential voltage lower than the high-potential voltage is provided. For example, when the seventh transistor is turned on, the drain electrode of the driving transistor may be electrically connected with the low-potential voltage line. When the seventh transistor is turned off, the drain electrode of the driving transistor may be electrically separated from the low-potential voltage line. In other words, the drain electrode of the driving transistor and the low-potential voltage line may be electrically separated from, or electrically connected to each other depending on the state of the light emission signal controlling the on/off of the seventh transistor.

According to another feature of the disclosure, the high-potential voltage line and the low-potential voltage line may have a mesh structure in which they are disposed in the row direction and the column direction.

According to another feature of the disclosure, the display device may further include a high-potential voltage pad providing a high-potential voltage to the high-potential voltage line and disposed on one surface of the substrate and a low-potential voltage pad providing a low-potential voltage to the low-potential voltage line and disposed on a surface facing the one surface of the substrate.

According to another feature of the disclosure, the reference voltage line providing the reference voltage may be disposed in parallel with the first scan signal line providing the first scan signal.

According to another feature of the disclosure, the display device may further include a fourth transistor connected between the gate electrode and the drain electrode and turned on by the first scan signal. The fourth transistor may include two transistors connected in series.

Here, the two transistors may be connected in series between the gate electrode and drain electrode of the sixth transistor which is the driving transistor and be turned on or off together by the first scan signal.

According to another feature of the disclosure, the display device may further include a second capacitor connected with the anode electrode and cathode electrode.

According to another feature of the disclosure, the display device may further include a third capacitor connected with the cathode electrode and the gate electrode.

According to another feature of the disclosure, the first scan signal to turn on the first transistor and the fourth transistor may completely overlap the second scan signal to turn on the second transistor.

According to another feature of the disclosure, the display device may further comprises one or more reflectors associated with a plurality of subpixels, wherein the one or more reflectors are capable of repairing respective subpixels and reflecting light emitted from the light emitting element upward of the light emitting element, when the respective subpixels are defective.

According to another feature of the disclosure, a defective subpixel is repaired by electrically connecting a reflector associated with the defective subpixel with a reflector associated with a corresponding subpixel in an adjacent row.

According to another feature of the disclosure, a driving period of the pixel circuit includes: a first period when a reference voltage is applied to the gate electrode; a second period when a gate-source voltage difference of the driving transistor is a threshold voltage of the driving transistor; a third period when the reference voltage is applied to the capacitor and a voltage of the gate electrode is varied due to a coupling phenomenon of the capacitor; a fourth period when a high-potential voltage higher than the reference voltage is applied to the source electrode; and a fifth period when the driving transistor is turned on to cause the light emitting element emits light.

Although the embodiments of the disclosure have been described in more detail with reference to the accompanying drawings, the disclosure is not necessarily limited to these embodiments, and may be variously modified without departing from the technical spirit of the disclosure. Accordingly, the embodiments set forth herein are provided for illustrative purposes, but not to limit the scope of the disclosure, and should be appreciated that the scope of the disclosure is not limited by the embodiments. Thus, it should be noted that the above-described embodiments are provided as examples and should not be interpreted as limiting.

What is claimed:

1. A display device, comprising:
a light emitting element;
a pixel circuit connected to the light emitting element, the pixel circuit including a driving transistor having a gate electrode, a source electrode, and a drain electrode, a first transistor including a source electrode connected to a data line and a drain electrode, and a capacitor connected with the gate electrode of the driving transistor and the drain electrode of the first transistor; and
a reference voltage line configured to supply a reference voltage,
wherein a driving period of the pixel circuit includes:
a first period when the pixel circuit is initialized,
a second period when a threshold voltage of the driving transistor is sampled,
a third period when the capacitor is coupled,
a fourth period when the driving transistor is in an on-bias state; and
a fifth period when the light emitting element emits light,
wherein the pixel circuit further includes a third transistor connected to the reference voltage line and controlled by a light emission signal.

2. The display device of claim 1, wherein during the first period the reference voltage is applied to the gate electrode of the driving transistor.

3. The display device of claim 1, wherein during the second period a gate-source voltage difference of the driving transistor is the threshold voltage of the driving transistor.

4. The display device of claim 1, wherein during the third period the reference voltage is applied to the capacitor and a voltage of the gate electrode of the driving transistor varies due to the coupling of the capacitor.

5. The display device of claim 1, wherein during the fourth period a high-potential voltage is applied to the source electrode of the driving transistor, the high-potential voltage greater than the reference voltage.

6. The display device of claim 1, wherein during the fifth period the driving transistor is turned on.

7. The display device of claim 1, wherein a gate-source voltage difference of the driving transistor during the second period is less than the gate-source voltage difference of the driving transistor during the first period, and the gate-source voltage difference of the driving transistor during the fourth period is greater than the gate-source voltage difference of the driving transistor during the second period.

8. The display device of claim 1, wherein a voltage of the gate electrode of the driving transistor during the third period is less than the voltage of the gate electrode of the driving period during the second period.

9. The display device of claim 1, wherein the light emission signal turns on the third transistor during the third period and the fifth period, and turns off the third transistor during the first period, the second period, and the fourth period.

10. The display device of claim 5, wherein the light emitting element includes an N-type semiconductor material layer and a P-type semiconductor material layer.

11. The display device of claim 10, wherein the N-type semiconductor material layer is connected to the source electrode of the driving transistor, and the P-type semiconductor material layer is connected with a high-potential voltage line that supplies the high-potential voltage.

12. The display device of claim 11, wherein the drain electrode of the driving transistor is configured to be electrically separated from or electrically connected to a low-potential voltage line that supplies a low-potential voltage that is less than the high-potential voltage.

13. The display device of claim 1, wherein the reference voltage is a first reference voltage level during the third period and a first portion of the fourth period, and is a second reference voltage level that is greater than the first reference voltage level during the fifth period.

14. The display device of claim 12, wherein the first transistor configured to apply a data voltage to capacitor responsive to being turned on by a first scan signal and wherein the pixel circuit further comprising a second transistor configured to apply the high-potential voltage to the source electrode of the driving transistor responsive to being turned on by a second scan signal.

15. The display device of claim 14, wherein an anode electrode of the light emitting element is connected to a high-potential voltage line supplies the high-potential voltage, and the drain electrode of the driving transistor is configured to be electrically separated from or connected to the low-potential voltage line that supplies the low-potential voltage that is less than the high-potential voltage.

16. The display device of claim 15, wherein the high-potential voltage line and the low-potential voltage line are disposed in a row direction and a column direction, and have a mesh structure.

17. The display device of claim 15, further comprising:
a substrate;
a high-potential voltage pad configured to supply the high-potential voltage to the high-potential voltage line, the high-potential voltage pad on one surface of the substrate; and
a low-potential voltage pad configured to supply the low-potential voltage to the low-potential voltage line, the low-potential voltage pad on a surface of the substrate facing the one surface of the substrate.

18. The display device of claim 14, wherein the reference voltage line is in parallel with a first scan signal line that supplies the first scan signal.

19. The display device of claim 14, further comprising:
a fourth transistor connected between the gate electrode of the driving transistor and the drain electrode of the driving transistor, the fourth transistor configured to be turned on by the first scan signal.

20. The display device of claim 19, wherein the fourth transistor includes a plurality of transistors connected in series between the gate electrode and the drain electrode of the driving transistor, and the plurality of transistors are turned on at a same time by the first scan signal.

21. The display device of claim 20, wherein the first transistor and the fourth transistor are on while the second transistor is on.

22. The display device of claim 1, further comprising:
a second capacitor connected to an anode electrode of the light emitting element and a cathode electrode of the light emitting element.

23. The display device of claim 21, further comprising:
a third capacitor connected to the cathode electrode of the light emitting element and the gate electrode of the driving transistor.

* * * * *